US012804939B2

(12) United States Patent
Du et al.

(10) Patent No.: US 12,804,939 B2
(45) Date of Patent: Nov. 17, 2026

(54) METHOD OF FABRICATING HIGH ELECTRON MOBILITY TRANSISTOR

(71) Applicant: Vanguard International Semiconductor Corporation, Hsinchu (TW)

(72) Inventors: Yang Du, Hsinchu City (TW); Shin-Chen Lin, Hsinchu County (TW); Chia-Ching Huang, Taoyuan City (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 17 days.

(21) Appl. No.: 18/677,934

(22) Filed: May 30, 2024

(65) Prior Publication Data

US 2024/0413236 A1 Dec. 12, 2024

Related U.S. Application Data

(62) Division of application No. 17/200,916, filed on Mar. 15, 2021, now Pat. No. 12,034,071.

(51) Int. Cl.

| | |
|---|---|
| ***H10D 30/47*** | (2025.01) |
| ***H10D 30/01*** | (2025.01) |
| ***H10D 62/824*** | (2025.01) |
| ***H10D 62/85*** | (2025.01) |
| ***H10D 64/00*** | (2025.01) |

(Continued)

(52) U.S. Cl.

CPC ......... *H10D 30/475* (2025.01); *H10D 30/015* (2025.01); *H10D 62/824* (2025.01); *H10D 62/8503* (2025.01); *H10D 64/112* (2025.01); *H10W 10/051* (2026.01); *H10W 10/50* (2026.01); *H10W 74/137* (2026.01)

(58) Field of Classification Search

CPC ... H10D 64/112; H10D 65/112; H10D 65/117

See application file for complete search history.

(56) References Cited

U.S. PATENT DOCUMENTS

| | | | |
|---|---|---|---|
| 9,673,311 | B1 | 6/2017 | Moens |
| 10,946,788 | B2 | 3/2021 | Osada |

(Continued)

FOREIGN PATENT DOCUMENTS

| | | | |
|---|---|---|---|
| CN | 104916682 | A | 9/2015 |
| CN | 106486543 | A | 3/2017 |

(Continued)

*Primary Examiner* — Matthew C Landau

(74) *Attorney, Agent, or Firm* — Winston Hsu

(57) ABSTRACT

A high electron mobility transistor includes a substrate, a semiconductor channel layer, a semiconductor barrier layer, a gate field plate, a source electrode, at least one first field plate, and a second field plate. The gate field plate is disposed on the semiconductor barrier layer. The source electrode is disposed on one side of the gate field plate, and the first field plate is disposed on the other side of the gate field plate and laterally spaced apart from the gate field plate. The second field plate covers the gate field plate and the first field plate and is electrically connected to the source electrode, where the area of the second field plate is larger than the sum of the area of the gate field plate and the area of the first field plate when perceived from a top-down perspective.

5 Claims, 9 Drawing Sheets

(51) Int. Cl.

| | |
|---|---|
| ***H10W 10/00*** | (2026.01) |
| ***H10W 10/50*** | (2026.01) |
| ***H10W 74/10*** | (2026.01) |

(56) References Cited

U.S. PATENT DOCUMENTS

| | | | | |
|---|---|---|---|---|
| 2009/0146186 | A1 | 6/2009 | Kub | |
| 2016/0343833 | A1 | 11/2016 | Huang | |
| 2018/0033669 | A1* | 2/2018 | Salih | H10D 30/475 |
| 2019/0035910 | A1 | 1/2019 | Moens | |
| 2019/0280092 | A1* | 9/2019 | Lin | H10D 64/112 |
| 2020/0098889 | A1 | 3/2020 | Chiu | |
| 2020/0373422 | A1 | 11/2020 | Kuraguchi | |
| 2021/0043724 | A1 | 2/2021 | Wu | |
| 2021/0384338 | A1* | 12/2021 | Li | H10D 30/475 |
| 2022/0208975 | A1* | 6/2022 | Khalil | H10D 30/60 |
| 2022/0293745 | A1 | 9/2022 | Isobe | |
| 2022/0375926 | A1* | 11/2022 | Liao | H10D 30/015 |

FOREIGN PATENT DOCUMENTS

| | | | |
|---|---|---|---|
| CN | 111509041 | A | 8/2020 |
| CN | 111883593 | A | 11/2020 |
| JP | 2015-170821 | A | 9/2015 |
| TW | 202042390 | A | 11/2020 |

* cited by examiner

METHOD OF FABRICATING HIGH ELECTRON MOBILITY TRANSISTOR

CROSS REFERENCE TO RELATED APPLICATIONS

This application is a division of U.S. application Ser. No. 17/200,916, filed on Mar. 15, 2021. The content of the application is incorporated herein by reference.

BACKGROUND OF THE INVENTION

1. Field of the Invention

The present disclosure relates generally to the field of transistors, and more particularly to high electron mobility transistors and methods of fabricating the same.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETS, HEMTs have a number of attractive properties such as high electron mobility and the ability to transmit signals at high frequencies. A conventional HEMT may include a compound semiconductor channel layer, a compound semiconductor barrier layer, a compound semiconductor capping layer and a gate electrode stacked in sequence. Using the gate electrode to apply a bias voltage on the compound semiconductor capping layer can adjust the concentration of 2-DEG in the compound semiconductor channel layer located under the compound semiconductor capping layer, and thereby control the turn-on/off of the HEMT. Moreover, a field plate is further disposed in the conventional HEMT to adjust the electric field distribution by the field plate, and thereby increase the breakdown voltage of the HEMT.

However, even though setting up a field plate in the HEMT can effectively improve the withstand voltage capability of the HEMT, this manner usually produces an additional capacitance. Therefore, it makes the HEMT produce a significant turn-on/off delay time, and thereby reduce the electrical performances of the HEMT.

SUMMARY OF THE INVENTION

In view of this, it is necessary to provide an improved high electron mobility transistor without the drawbacks of conventional high electron mobility transistors.

According to one embodiment of the present disclosure, a HEMT is disclosed and includes a substrate, a semiconductor channel layer, a semiconductor barrier layer, a gate field plate, a source electrode, at least one first field plate, and a second field plate. The gate field plate is disposed on the semiconductor barrier layer. The source electrode is disposed on one side of the gate field plate, and the first field plate is disposed on another side of the gate field plate and laterally spaced apart from the gate field plate. The second field plate covers the gate field plate and the first field plate, and is electrically connected to the source electrode, where the area of the second field plate is larger than the sum of the area of the gate field plate and the area of the first field plate when perceived from a top-down perspective.

According to one embodiment of the present disclosure, a HEMT is disclosed and includes a substrate, a semiconductor channel layer, a semiconductor barrier layer, a gate field plate, a first field plate, a first interlayer dielectric layer, and a second field plate. The gate field plate and the first field plate are disposed on the semiconductor barrier layer, where the gate field plate and the first field plate are laterally spaced apart from each other. The first interlayer dielectric layer conformally covers the gate field plate and the first field plate, where the thickness of the first interlayer dielectric layer is between 1000 Angstroms and 3500 Angstroms. The second field plate extends over the gate field plate and the first field plate, and conformally covers the first interlayer dielectric layer.

According to one embodiment of the present disclosure, a method of fabricating a HEMT is disclosed and includes the following steps. A substrate having a semiconductor channel layer, a semiconductor barrier layer, and a passivation layer disposed thereon in sequence is provided; a gate field plate and at least one first field plate are formed, where the gate field plate and the at least one first field plate are laterally spaced apart from each other; a first interlayer dielectric layer is formed to conformally cover the gate field plate and the at least one first field plate; and a source electrode and a second field plate are formed, where the second field plate conformally covers the first interlayer dielectric layer and extends over the gate field plate and the at least one first field plate.

According to the embodiments of the present disclosure, a gate field plate and a first field plate may be disposed between a semiconductor channel layer and a second field plate, and the gate field plate and the first field plate are laterally spaced apart from each other in a predetermined direction. With this configuration, not only the increase in capacitance and the turn-on/off delay time caused by the excessive extension of the gate field plate in the predetermined direction can be avoided, but the breakdown voltage of the HEMT can be substantially maintained.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
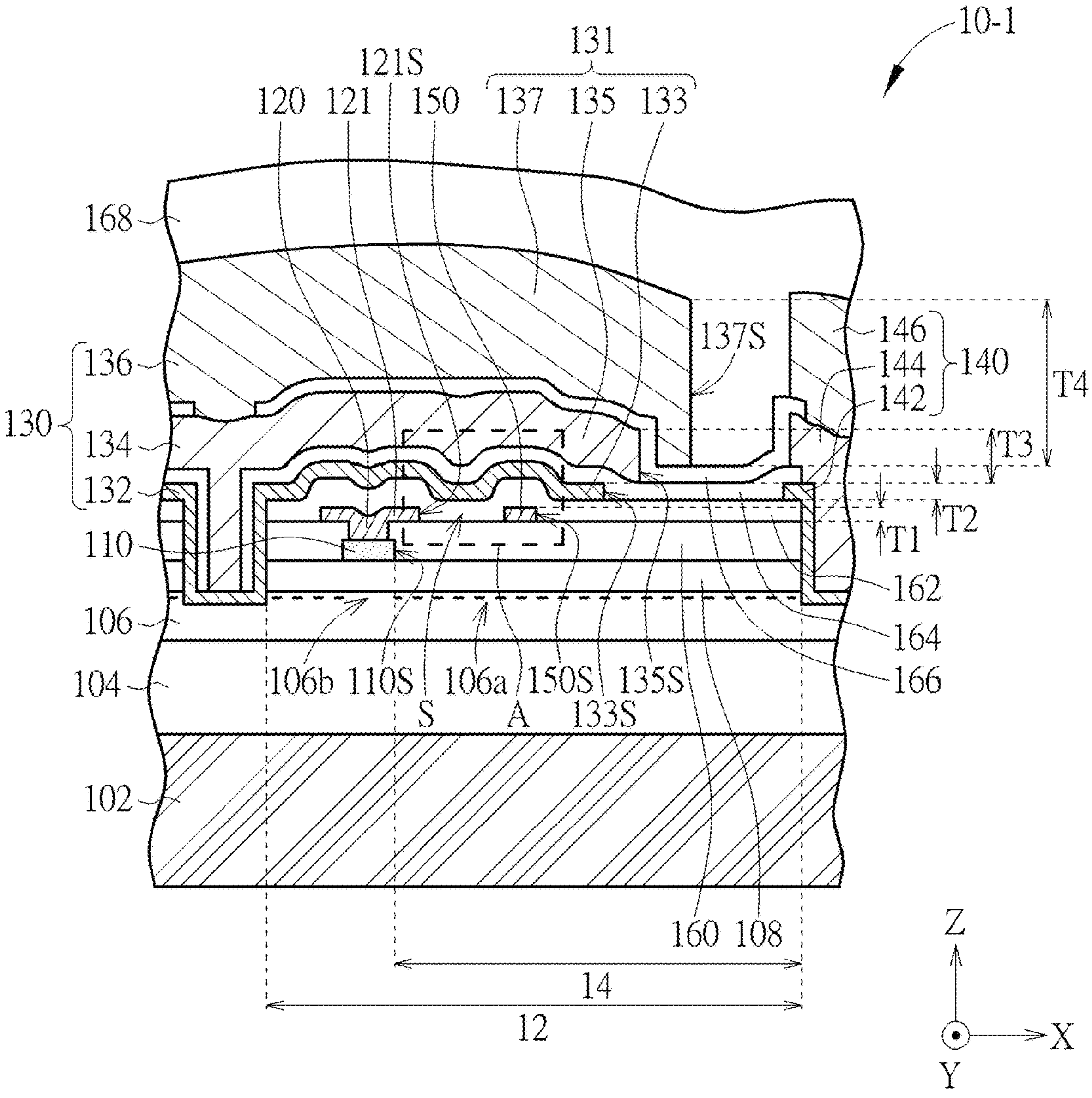
FIG. 1 is a schematic cross-sectional diagram of a high electron mobility transistor (HEMT) according to one embodiment of the disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

The present disclosure is directed to a high electron mobility transistor (HEMT), which may be used as power switching transistors for voltage converter applications. Compared to silicon power transistors, III-V HEMTs feature low on-state resistances and low switching losses due to wide bandgap properties.

FIG. 1 is a schematic cross-sectional diagram of a high electron mobility transistor (HEMT) according to one embodiment of the present disclosure. Referring to FIG. 1, according to one embodiment of the present disclosure, a high electron mobility transistor (HEMT) 10-1, such as an enhancement mode high electron mobility transistor, is disposed on a substrate 102. Moreover, an optional buffer layer 104, a semiconductor channel layer 106, a semiconductor barrier layer 108, and a semiconductor capping layer 110 may be stacked on the substrate 102 in sequence. A gate electrode 120, a gate field plate 121 and a first field plate 150 may be disposed on the semiconductor barrier layer 108. A source electrode 130 may be disposed on one side of the gate field plate 121, and a drain electrode 140 and the first field plate 150 may be disposed on another side of the gate field plate 121. The first field plate 150 may be laterally spaced apart from the gate field plate 121 in a predetermined direction (e.g., an X-direction). A second field plate 133 may cover the gate field plate 121 and the first field plate 150, and be electrically connected to the source electrode 130.

According to one embodiment of the present disclosure, an optional passivation layer 160 may be disposed between the semiconductor barrier layer 108 and the first field plate 150. Moreover, a field plate 131 (e.g., the first field plate 150, a second field plate 133, a third field plate 135, and a fourth field plate 137) and an interlayer dielectric layer 160 (e.g., a first interlayer dielectric layer 162, a second interlayer dielectric layer 164, a third interlayer dielectric layer 166, and a fourth interlayer dielectric layer 168) may be alternately stacked on the passivation layer 160. As a result, the first interlayer dielectric layer 162 may be disposed between the first field plate 150 and the second field plate 133. The second interlayer dielectric layer 164 may be disposed between the second field plate 133 and the third field plate 135. The third interlayer dielectric layer 166 may be disposed between the third field plate 135 and the fourth field plate 137. According to one embodiment of the present disclosure, the respective thicknesses T1, T2, T3 and T4 of the first field plate 150, the second field plate 133, the third field plate 135 and the fourth field plate 137 may be in increasing order (e.g., T1<T2<T3<T4), but not limited thereto.

According to one embodiment of the present disclosure, the substrate 102 may be a bulk silicon substrate, a silicon carbide (Sic) substrate, a sapphire substrate, a silicon-on-insulator (SOI) substrate or a germanium-on-insulator (GOI) substrate, but not limited thereto. In another embodiment, the substrate 102 further includes a single-layered or multi-layered insulating material layer and/or other suitable material layers (e.g. semiconductor layers) and a core layer. The insulating material layer may be oxide, nitride, oxynitride, or other suitable insulating materials. The core layer may be silicon carbide (SiC), aluminum nitride (AlN), aluminum gallium nitride (AlGaN), zinc oxide (ZnO) or gallium oxide ($Ga_2O_3$), or other suitable ceramic materials. In one embodiment, the single-layered or multi-layered insulating material layer and/or the other suitable material layers may wrap the core layer.

According to one embodiment of the present disclosure, the buffer layer 104 may be used to reduce the stress or the degree of lattice mismatch between the substrate 102 and the semiconductor channel layer 106. According to one embodiment of the present disclosure, the buffer layer 104 may include a plurality of sub-semiconductors, and the overall resistance value thereof is higher than the resistance values of other layers on the substrate 102. In one embodiment, the proportion of some elements in the buffer layer 104, such as metal elements, may be gradually changed in the direction from the substrate 102 to the semiconductor channel layer 106. In one embodiment, for the case where the substrate 102 and the semiconductor channel layer 106 are a silicon substrate and an i-GaN layer, respectively, the buffer layer 104 may be aluminum gallium nitride ($Al_xGa_{(1-x)}N$) with a gradual change in the composition ratio. Moreover, in the direction from the substrate 102 to the semiconductor channel layer 106, the X value will decrease from 0.9 to 0.15 in a continuous or stepwise manner.

According to one embodiment of the present disclosure, the semiconductor channel layer 106 may include one or more layers of group III-V semiconductor layers, and the composition of the group III-V semiconductor layers may be GaN, AlGaN, InGaN, or InAlGaN, but not limited thereto. In addition, the semiconductor channel layer 106 may also be one or more layers of doped group III-V semiconductor layers, for example, a p-type group III-V semiconductor layer. For the P-type group III-V semiconductor layer, the dopant may be C, Fe, Mg, or Zn, but not limited thereto. The semiconductor barrier layer 108 may include one or more layers of group III-V semiconductor layers, and its composition may be different from that of the group III-V semiconductor of the semiconductor channel layer 106. In one embodiment, the semiconductor barrier layer 108 may include AlN, $Al_yGa_{(1-y)}N$ ($0<y<1$), or a combination thereof. According to one embodiment, the semiconductor channel layer 106 may be an undoped GaN layer, and the semiconductor barrier layer 108 may be an intrinsic n-type AlGaN layer. For the active region 12 of the high electron mobility transistor 10-1, since there is a bandgap discontinuity between the semiconductor channel layer 106 and the semiconductor barrier layer 108, by stacking the semiconductor channel layer 106 and the semiconductor barrier layer 108 on each other (and vice versa), a thin layer of two-dimensional electron gas (2-DEG) may be accumulated in a region, i.e., 2-DEG region 106*a*, near the heterojunction between the semiconductor channel layer 106 and the semiconductor barrier layer 108 due to the piezoelectric effect. In contrast, 2-DEG may not be generated in the region covered by the semiconductor capping layer 110, and thus this region may be regarded as a 2-DEG cutoff region 106*b*.

According to one embodiment of the present disclosure, the semiconductor capping layer 110 disposed above the semiconductor barrier layer 108 may include one or more layers of group III-V semiconductor layers, and the composition of the group III-V semiconductor layers may be GaN, AlGaN, InGaN or InAlGaN, but not limited thereto. The semiconductor capping layer 110 may be one or more layers of doped group III-V semiconductor layers, for example, a p-type group III-V semiconductor layer. For the P-type group III-V semiconductor layer, the dopant may be C, Fe, Mg or Zn, but not limited thereto. According to one embodiment of the present disclosure, the semiconductor capping layer 110 may be a p-type GaN layer.

According to one embodiment of the present disclosure, the gate electrode 120 may be disposed between the semiconductor barrier layer 108 and the second field plates 133. The gate electrode 120 may be a single-layered or multi-layered structure, and the gate electrode 120 may be electrically connected to the underlying semiconductor capping layer 110, such as a Schottky contact. The composition of the gate electrode 120 may be, for example, TiN, W, Pt, Ni, Ti, Al, Au, Mo, stacked layers thereof, or alloys thereof, but not limited thereto.

According to one embodiment of the present disclosure, the passivation layer 160 may cover the semiconductor barrier layer 108, which can be used to eliminate or reduce the surface defects existing on the top surface of the semiconductor barrier layer 108 and the side surface 110S of the semiconductor capping layer 110, and thereby the electrical performance of the HEMT 10-1 is improved. According to one embodiment of the present disclosure, the composition of the passivation layer 160 may be silicon nitride (Si3N4), silicon oxynitride (SiON), aluminum nitride (AlN), aluminum oxide ($Al_2O_3$) or silicon oxide ($SiO_2$), but not limited thereto.

According to one embodiment of the present disclosure, the gate field plate 121 and the first field plate 150 may conformally cover a partial surface of the passivation layer 160, and there is a gap S between the gate field plate 121 and the first field plate 150. The gate field plate 121 may be electrically connected to the gate electrode 120, and the first field plate 150 may be electrically floating or electrically connected to the source electrode 130. According to one embodiment of the present disclosure, the side surface 121S of the gate field plate 121 may protrude outward from the side surface 110S of the semiconductor capping layer 110, and the first field plate 150 may be disposed between the gate field plate 121 and the drain electrode 140. Therefore, the gate field plate 121 and the first field plate 150 may both overlap the drift region 14 of the HEMT 10-1. According to one embodiment of the present disclosure, the side surface 121S of the gate field plate 121 may also be aligned with or retracted from the side surface 110S of the semiconductor capping layer 110, but not limited thereto. According to one embodiment of the present disclosure, the gate field plate 121 and the first field plate 150 may be a single-layered or multi-layered structure, and their composition may be a metal, an alloy or stacked layers thereof, such as TiN, W, Pt, Ni, Ti, Al, Au, Mo, their stacked layers, or their alloys, but not limited thereto.

According to one embodiment of the present disclosure, the first interlayer dielectric layer 162 may conformally cover the passivation layer 160, the gate field plate 121 and the first field plate 150, and fill up the gap S between the gate field plate 121 and the first field plate 150. The material of the first interlayer dielectric layer 162 may be selected from $Si_3N_4$, AlN, $Al_2O_3$, $SiO_2$, or a combination thereof, but not limited thereto. The thickness of the first interlayer dielectric layer 162 may be 1000 Angstroms to 3500 Angstroms, but not limited thereto.

According to one embodiment of the present disclosure, the second field plate 133, the second interlayer dielectric layer 164, the third field plate 135, the third interlayer dielectric layer 166, the fourth field plate 137, and the fourth interlayer dielectric layer 168 may be stacked in sequence on the first interlayer dielectric layer 162. In addition, the second field plate 133, the second interlayer dielectric layer 164, the third field plate 135, and the third interlayer dielectric layer 166 may be conformally disposed on the underlying layers, but not limited thereto. In one embodiment, the second field plate 133, the third field plate 135, and the fourth field plate 137 may all extend laterally over the top surfaces of the gate field plate 121 and the first field plate 150. Compared with the side surface 150S of the first field plate 150, the side surface 133S of the second field plate 133, the side surface 135S of the third field plate 135, and the side surface 137S of the fourth field plate 137 may sequentially become more and more close to the drain electrode 140. The second field plate 133, the third field plate 135, and the fourth field plate 137 may be a single-layered or multi-layered structure, and their composition may include conductive metals, such as W, Pt, Ni, Ti, Al, Au, Mo, Ti, Au, but not limited thereto. According to one embodiment of the present disclosure, the materials of the second interlayer dielectric layer 164, the third interlayer dielectric layer 166, and the fourth interlayer dielectric layer 168 may be selected from $Si_3N_4$, AlN, $Al_2O_3$, $SiO_2$, or a combination thereof, but not limited thereto.

The source electrode 130 and the drain electrode 140 may individually penetrate the first interlayer dielectric layer 162, the passivation layer 160, and the semiconductor barrier layer 108, and are electrically connected to the semiconductor channel layer 106 below. In one embodiment, the source electrode 130 and the drain electrode 140 may each have a stacked structure. According to one embodiment of the present disclosure, the source electrode 130 may include a first source layer 132, a second source layer 134, and a third source layer 136 from bottom to top. The second field plate 133 can be regarded as an outwardly extending section of the first source layer 132. The third field plate 135 can be regarded as an outwardly extending section of the second source layer 134. The fourth field plate 137 can be regarded as an outwardly extending section of the third source layer 136. Similarly, the drain electrode 140 may include a first drain layer 142, a second drain layer 144, and a third drain layer 146 from bottom to top. According to one embodiment of the present disclosure, the compositions of the first source layers 132 and the first drain layer 142 may include an ohmic contact metal. The ohmic contact metal refers to a metal, an alloy, or stacked layers thereof that can produce ohmic contact with the semiconductor channel layer 106, such as Ti, Ti/Al, Ti/Al/Ti/TiN, Ti/Al/Ti/Au, Ti/Al/Ni/Au or Ti/Al/Mo/Au, but not limited thereto. When operating the HEMT 10-1, the absolute value of the voltage applied to the source electrode 130 will be smaller than the absolute value of the voltage applied to the drain electrode 140.

Figure 2:
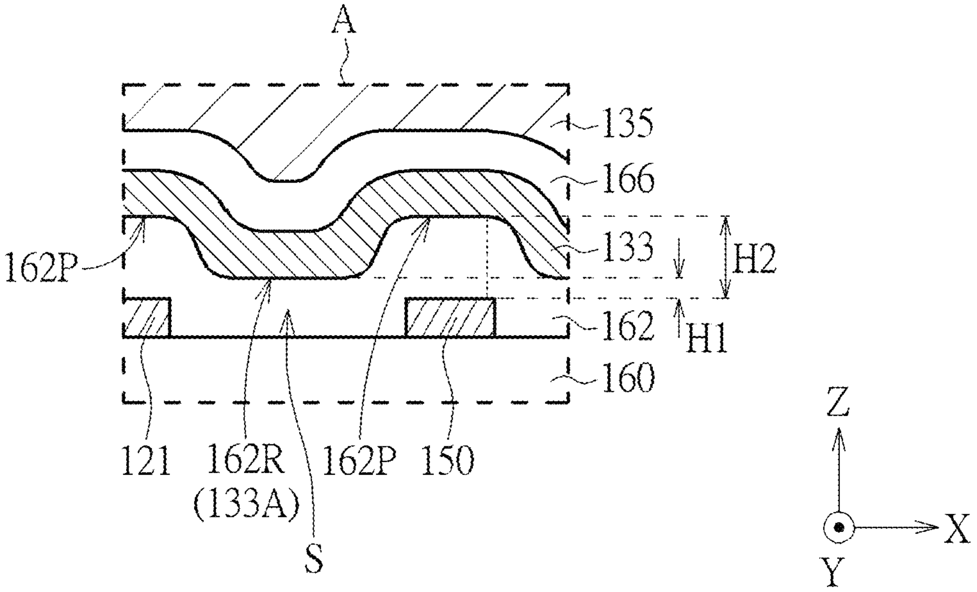
FIG. 2 is a schematic enlarged cross-sectional diagram of a partial area of a HEMT according to one embodiment of the disclosure.

FIG. 2 is a schematic enlarged cross-sectional diagram of a partial area of a HEMT according to one embodiment of the present disclosure, which can correspond to the area A shown in the embodiment of FIG. 1. Referring to FIG. 2, the surface of the conformal first interlayer dielectric layer 162 may include at least one recessed region 162R and at least one raised region 162P. The recessed region 162R may be disposed directly above the gap between the gate field plate 121 and the first field plates 150, and each of the raised regions 162P may be disposed directly above the gate field plate 121 and the first field plate 150 respectively. According to one embodiment of the present disclosure, the second field plate 133 conformally covers the recessed region 162R and the raised regions 162P. Therefore, there are multiple vertical heights between the bottom surface 133A of the second field plate 133 and the top surface of the first field plate 150, for example, a first height H1, and a second height H2. The first height H1 is smaller than the second height H2. In addition, the first field plate 150 may be electrically floating or electrically connected to the second field plate 133, depending on actual requirements. According to one embodiment of the present disclosure, compared to one portion of the second field plate 133 directly above the first field plate 150, another portion of the second field plate 133 directly above the gap S can be closer to the semiconductor layer under the passivation layer 160, for example, closer to the top surface of the semiconductor channel layer 106. Therefore, it can more effectively suppress the high electric field existing in the semiconductor channel layer 106, or redistribute the electric field in the semiconductor channel layer 106. In addition, when the vertical distance between the recessed region 162R and the top surface of the passivation layer 160 is less than 3500 Angstroms, for example, 1000 Angstroms to 3500 Angstroms, the second field plate 133 can exhibit a better electric field suppression effect.

Figure 3:
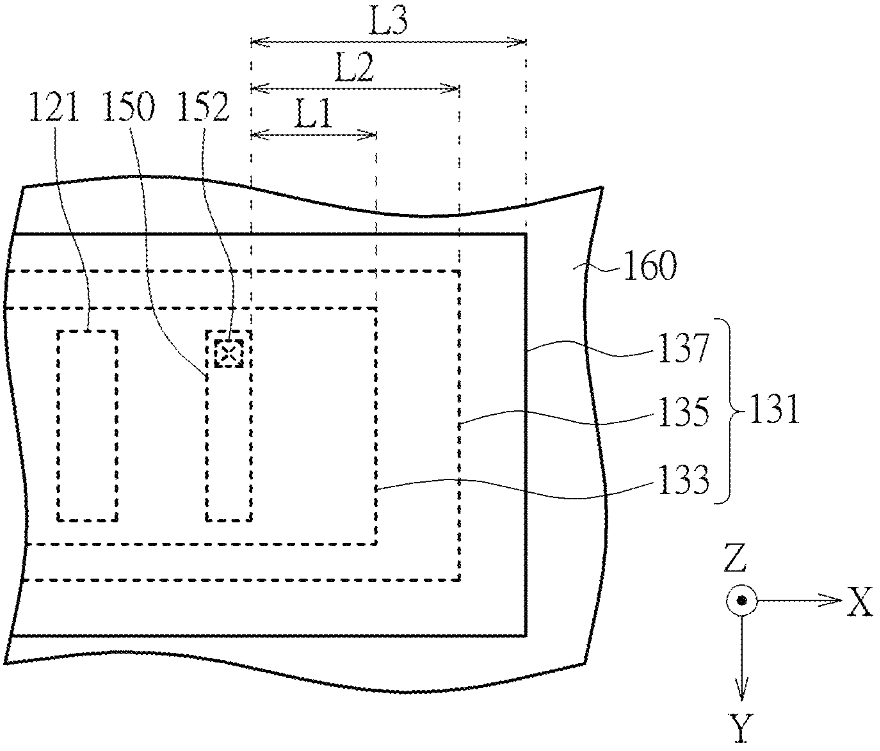
FIG. 3 is a schematic top-down perspective diagram of a partial area of a HEMT according to one embodiment of the disclosure.

FIG. 3 is a schematic top-down perspective diagram of a partial area of a HEMT according to one embodiment of the present disclosure. Referring to FIG. 3, the gate field plate 121 and the first field plate 150 may be rectangular and extend continuously in the same direction, for example, in the Y direction. According to one embodiment of the present disclosure, for the case where the first field plate 150 is electrically connected to the upper field plate 131, for example electrically connected to the second field plate 133, a contact plug 152 may be disposed between the first field plate 150 and the second field plate 133. The second field plate 133, the third field plate 135, and the fourth field plate 137 may be stacked in sequence along the Z direction. At least one edge of the second field plate 133, at least one edge of the third field plate 135, and at least one edge of the fourth field plate 137 may individually extend outward along the X direction. Therefore, a distance L1 is between the edge of the second field plate 133 and the edge of the first field plate 150. A distance L2 is between the edge of the third field plate 135 and the edge of the first field plate 150. A distance L3 is between the edge of the fourth field plate 137 and the edge of the first field plate 150. The distances L1, L2 and L3 may be in increasing order (i.e. L1<L2<L3). According to one embodiment of the present disclosure, when perceived from a top-down perspective, the area of the second field plate 133 may be larger than the sum of the area of the gate field plate 121 and the area of the first field plate 150. According to one embodiment of the present disclosure, the area of the third field plate 135 may be larger than the area of the second field plate 133. According to one embodiment of the present disclosure, the area of the fourth field plate 137 may be larger than the area of the third field plate 135.

According to the above mentioned embodiments, the gate field plate 121 and the first field plate 150 are disposed between the semiconductor channel layer 106 and the second field plate 133, and the gate field plate 121 and the first field plate 150 are laterally spaced apart from each other along a predetermined direction (e.g., the X direction). In addition, the first field plate 150 is electrically floating or electrically connected to the source electrode 130, so that the voltage applied to the first field plate 150 may not be the same as the voltage applied to the gate field plate 121. Therefore, excessive overlap of the gate field plate 121 and the drift region 14 can be avoided, and thereby the increase in capacitance and the turn-on/off delay time caused by the gate field plate 121 can be avoided. In addition, the breakdown voltage of the HEMT can still be substantially maintained.

Figure 4:
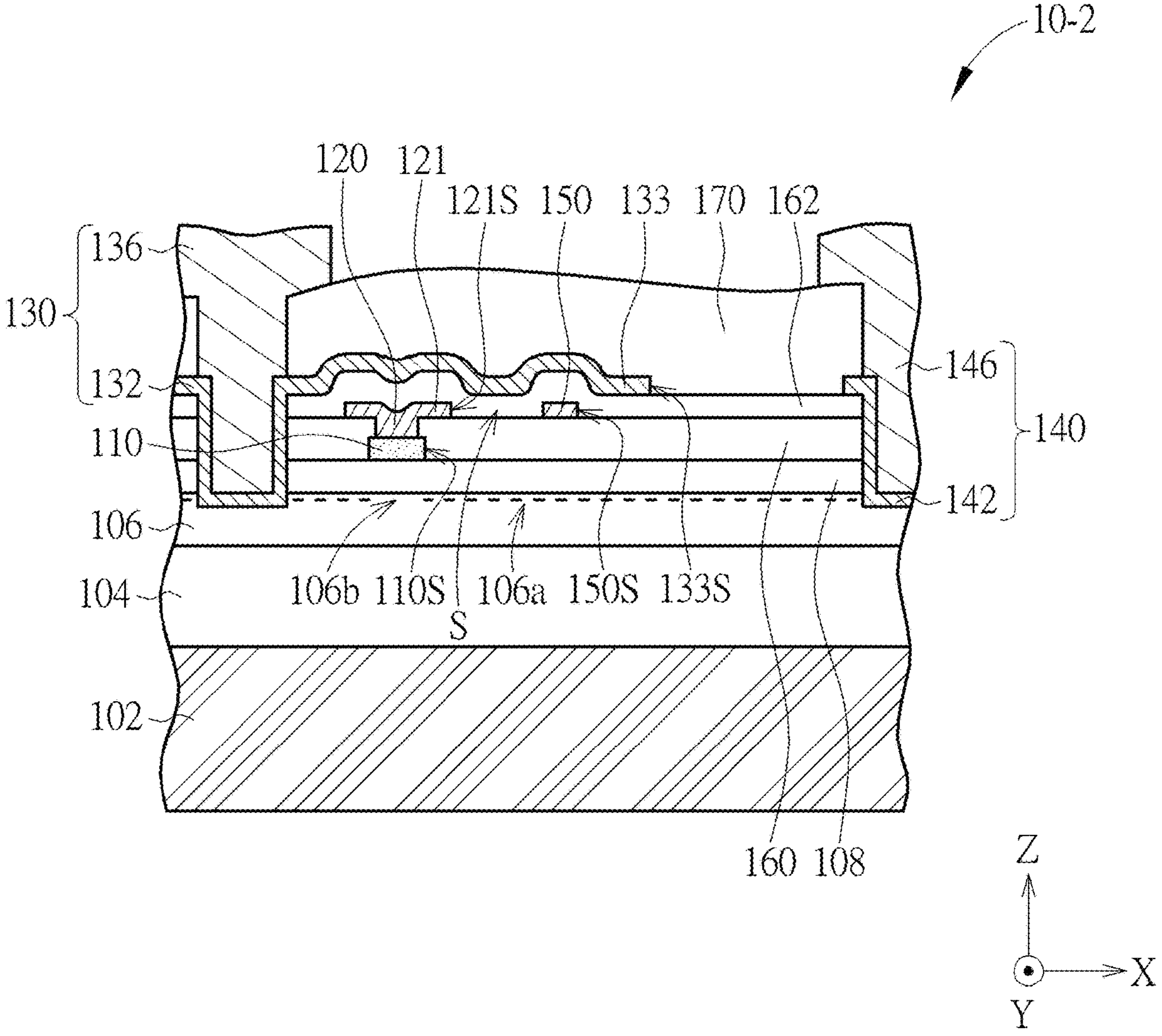
FIG. 4 is a schematic cross-sectional diagram of a HEMT where each of a source electrode and a drain electrode is a double-layered stack according to another embodiment of the disclosure.

FIG. 4 is a schematic cross-sectional diagram of a HEMT where each of a source electrode and a drain electrode is a double-layered stack according to another embodiment of the present disclosure. Referring to FIG. 4, the HEMT 10-2 of FIG. 4 is similar to the HEMT 10-1 of FIG. 1. The main difference is that no other field plate is disposed above the second field plate 133 of the HEMT 10-2, and the second field plate 133 is covered by a top dielectric layer 170. The source electrode 130 and the drain electrode 140 may each have a double-layered stack structure, and penetrate through the top dielectric layer 170, the first interlayer dielectric layer 162, the passivation layer 160, and the semiconductor barrier layer 108. According to one embodiment of the present disclosure, the source electrode 130 may include a first source layer 132 and a third source layer 136 from bottom to top, and the second field plate 133 may be regarded as an outward extending section of the first source layer 132. Similarly, the drain electrode 140 may include a first drain layer 142 and a third drain layer 146 from bottom to top.

Figure 5:
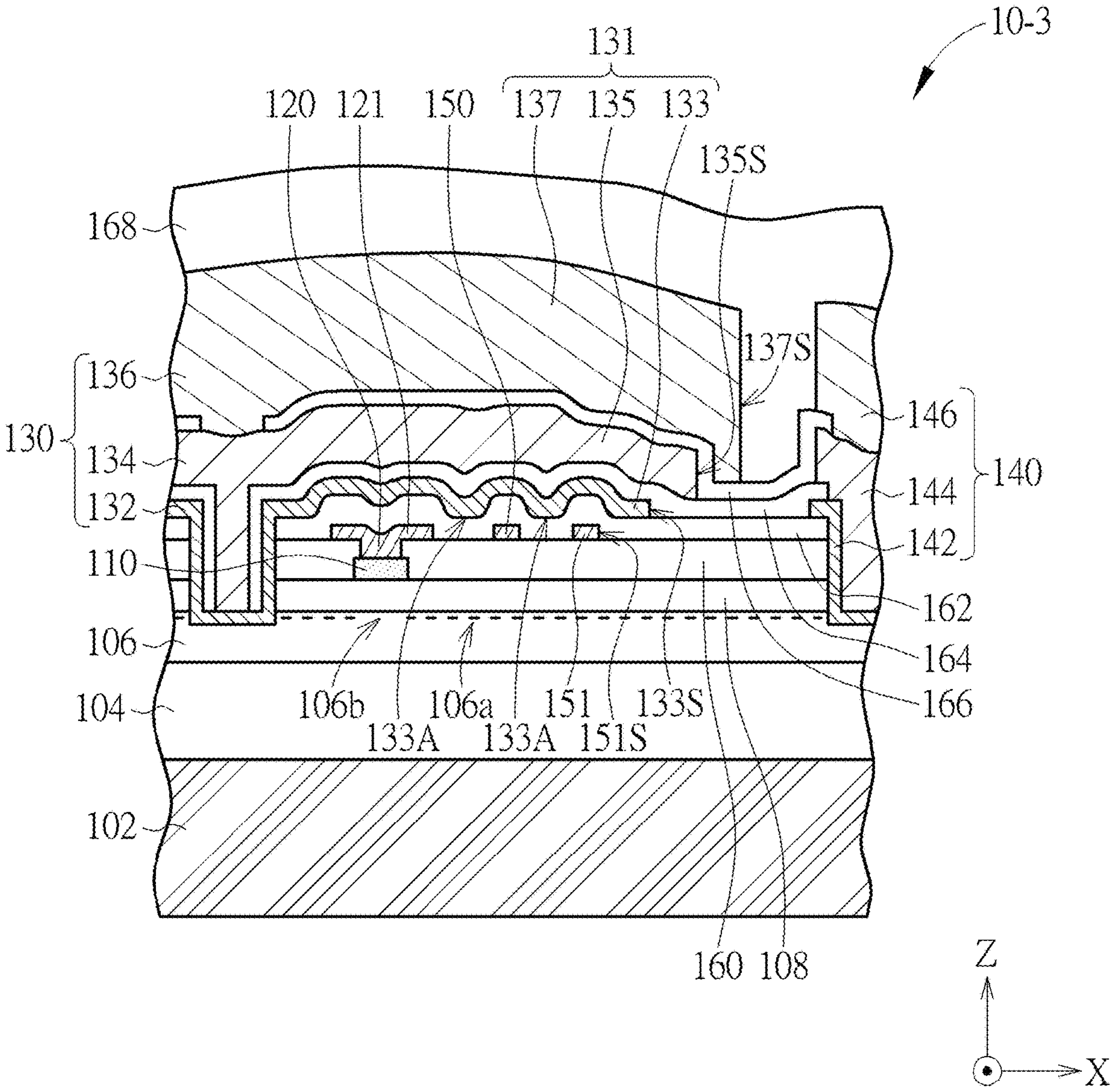
FIG. 5 is a schematic cross-sectional diagram of a HEMT having multiple first field plates according to another embodiment of the disclosure.

FIG. 5 is a schematic cross-sectional diagram of a HEMT having multiple first field plates according to another embodiment of the present disclosure. Referring to FIG. 5, the HEMT 10-3 of FIG. 5 is similar to the HEMT 10-1 of FIG. 1. The main difference is that the HEMT 10-3 includes a plurality of first field plates, such as two first field plates 150 and 151, and compared to the first field plate 150, the first field plate 151 may be closer to the drain electrode 140. The second field plate 133 may extend over each of the first field plates 150 and 151, so that the side surface 133S of the second field plate 133 is closer to the drain electrode 140 than the side surface 151S of the first field plate 151 is.

Figure 6:
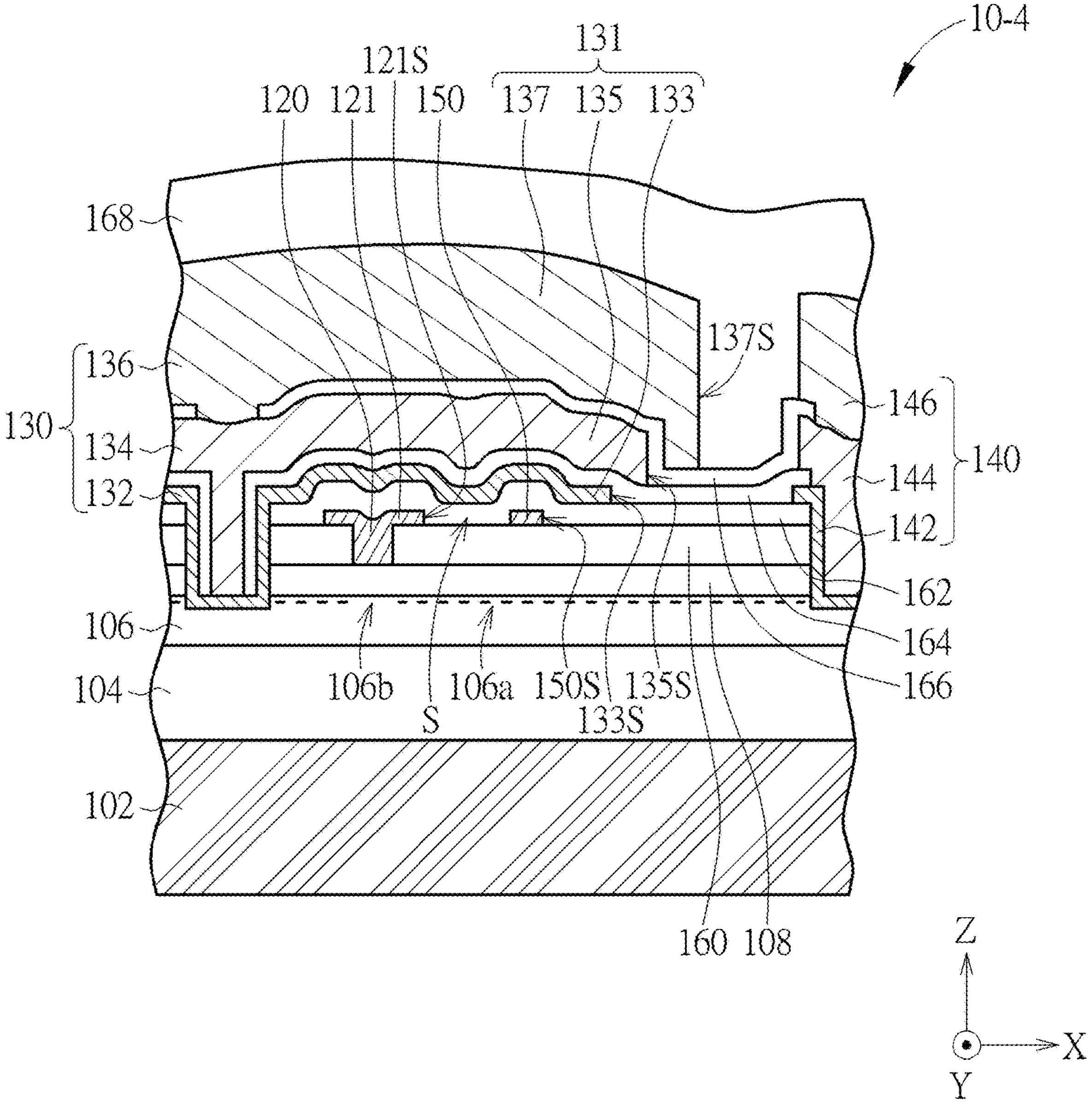
FIG. 6 is a schematic cross-sectional diagram of a HEMT where a gate electrode is in direct contact with a semiconductor barrier layer according to another embodiment of the disclosure.

FIG. 6 is a schematic cross-sectional diagram of a HEMT where a gate electrode is in direct contact with a semiconductor barrier layer according to another embodiment of the present disclosure. Referring to FIG. 6, the HEMT 10-4 of FIG. 6 is similar to the HEMT 10-1 of FIG. 1. The main difference is that the gate electrode 120 of the HEMT 10-4 is in direct contact with the semiconductor barrier layer 108 without a semiconductor capping layer. Therefore, according to this embodiment, the HEMT 10-4 may be a depletion mode HEMT.

In order to enable a person having ordinary skill in the art to implement the embodiments of the present disclosure, the following further describes the fabricating method of the disclosed HEMTs.

Figure 7:
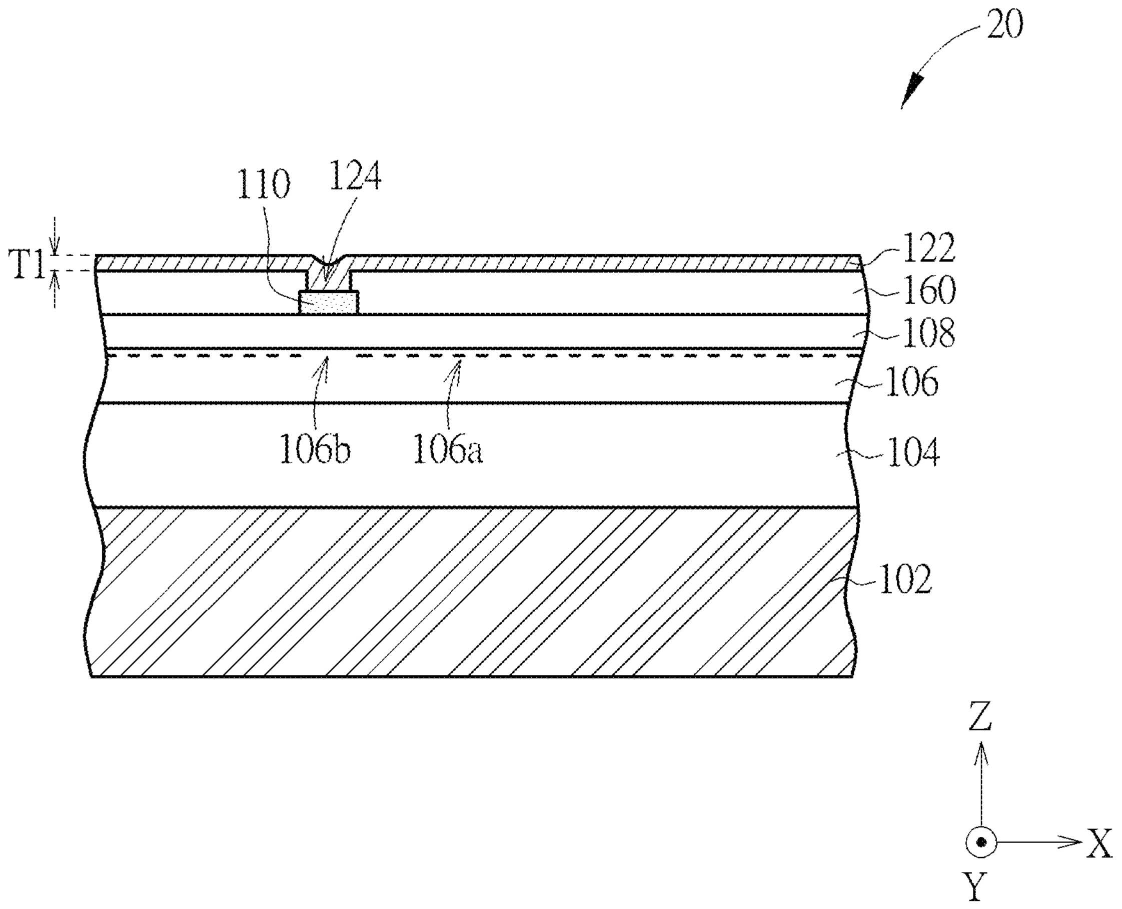
FIG. 7 is a schematic cross-sectional diagram of fabricating a HEMT which includes a semiconductor layer and a first metal layer stacked in sequence according to one embodiment of the disclosure.

FIG. 7 is a schematic cross-sectional diagram of fabricating a HEMT according to one embodiment of the present disclosure, which includes a semiconductor layer and a first metal layer stacked in sequence. According to one embodiment of the present disclosure, a buffer layer 104, a semiconductor channel layer 106, a semiconductor barrier layer 108, a semiconductor capping layer 110 and a passivation layer 160 may be disposed in sequence on the substrate 102 in the semiconductor structure 20. A gate contact hole 124 may be disposed in the passivation layer 160 to expose the semiconductor capping layer 110 below the passivation layer 160. The stacked layers on the substrate 102 may be formed by any suitable methods, such as molecular-beam epitaxy (MBE), metal-organic chemical vapor deposition (MOCVD), hydride vapor phase epitaxy (HVPE), atomic layer deposition (ALD) or other suitable methods. Subsequently, still referring to FIG. 7, a first metal layer 122 is conformally formed on the top surface of the passivation layer 160 and in the gate contact hole 124 through a suitable deposition process. The first metal layer 122 is, for example, a composite conductive layer including Schottky contact metal. In one embodiment, the thickness T1 of the first metal layer 122 may be 500 Angstroms to 2000 Angstroms, but not limited thereto.

Figure 8:
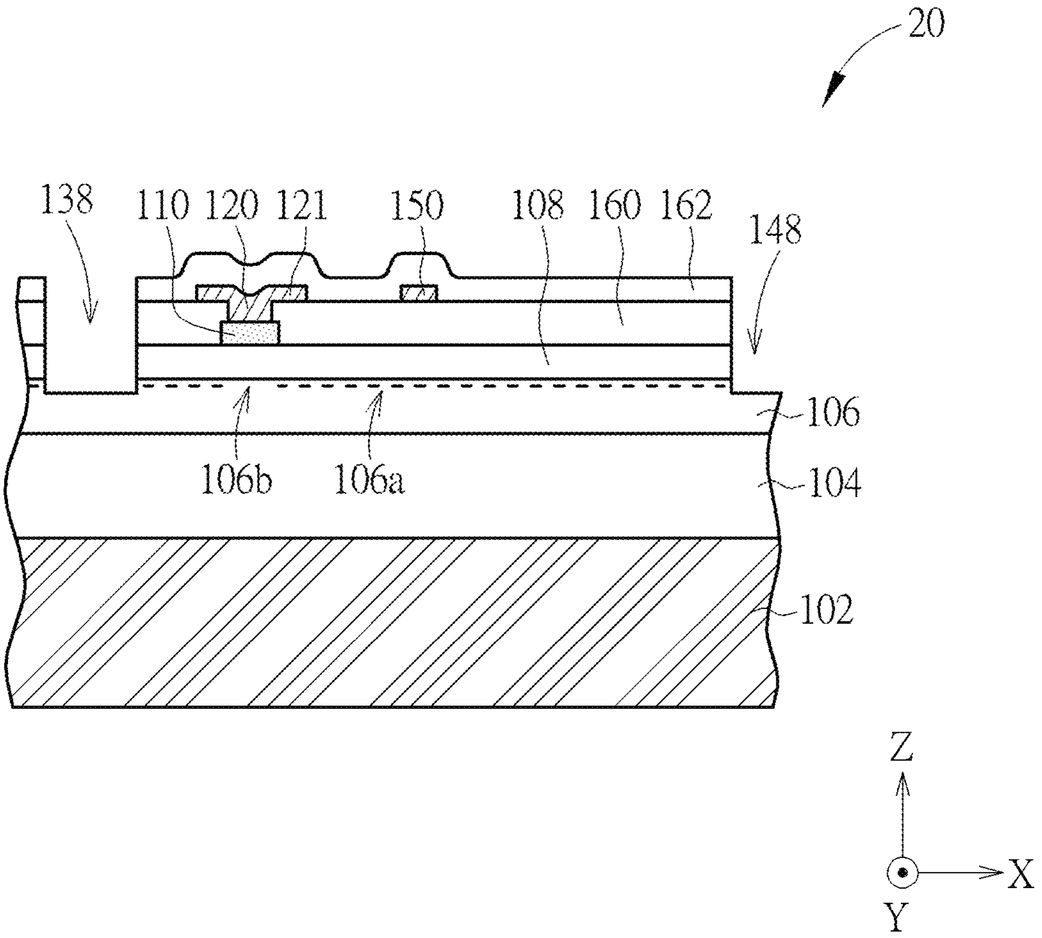
FIG. 8 is a schematic cross-sectional diagram of fabricating a HEMT which includes source and drain contact holes disposed in a passivation layer and a first interlayer dielectric layer according to one embodiment of the disclosure.

FIG. 8 is a schematic cross-sectional diagram of fabricating a HEMT according to one embodiment of the present disclosure, where includes source and drain contact holes disposed in a passivation layer and a first interlayer dielectric layer. After the process of FIG. 7 is completed, photolithography and etching processes may be performed to pattern the first metal layer 122 to form the gate electrode 120, the gate field plate 121, and the first field plate 150. Subsequently, a suitable deposition process may be performed to form a conformal first interlayer dielectric layer 162 so that the first interlayer dielectric layer 162 can cover the gate field plate 121 and the first field plate 150. Afterwards, photolithography and etching processes may be performed to etch the first interlayer dielectric layer 162, the passivation layer 160, and the semiconductor barrier layer 108 in sequence. As a result, a source contact hole 138 and a drain contact hole 148 are formed on two opposite sides of the first field plate 150 respectively.

Figure 9:
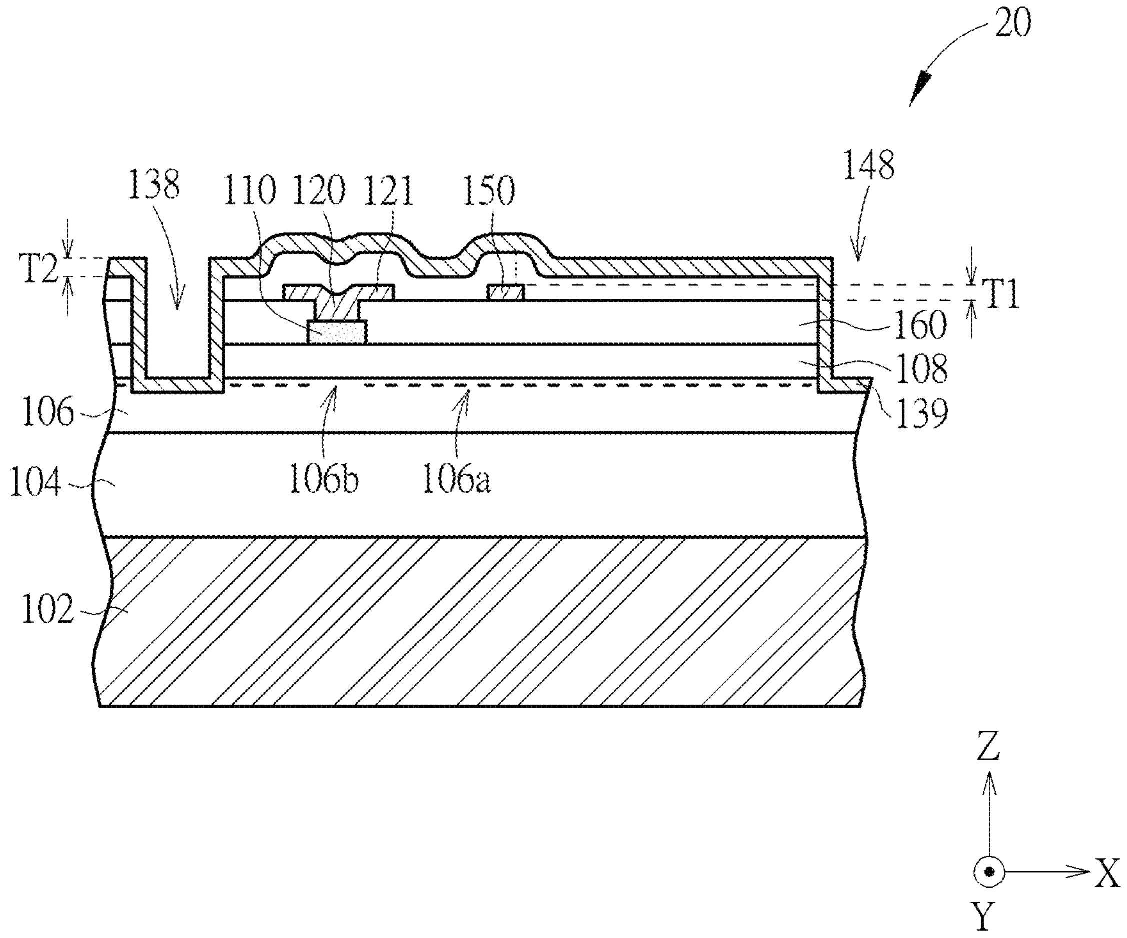
FIG. 9 is a schematic cross-sectional diagram of fabricating a HEMT which includes a second metal layer covering a first interlayer dielectric layer according to one embodiment of the disclosure.

FIG. 9 is a schematic cross-sectional diagram of fabricating a HEMT according to one embodiment of the present disclosure, where includes a second metal layer covering the first interlayer dielectric layer. After the process of FIG. 8 is completed, a suitable deposition process may be performed to form a conformal second metal layer 139 on the top surface of the first interlayer dielectric layer 162, in the source contact hole 138, and in the drain contact hole 148. The second metal layer 139 is, for example, a composite conductive layer including ohmic contact metal. In one embodiment, the thickness T2 of the second metal layer 139 may be 550 Angstroms to 2500 Angstroms, which may be greater than the thickness T1 of the first metal layer 122, but not limited thereto.

Figure 10:
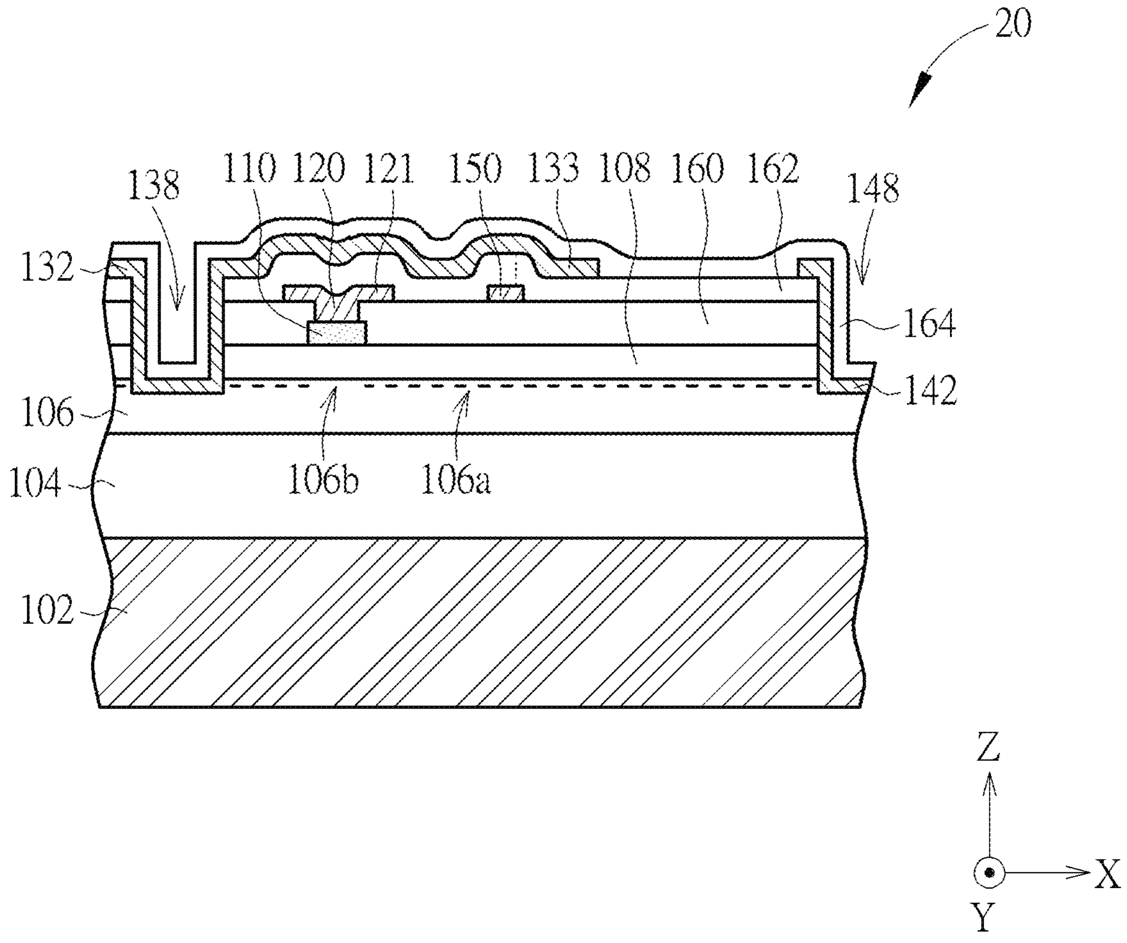
FIG. 10 is a schematic cross-sectional diagram of fabricating a HEMT which includes a second interlayer dielectric layer covering a second field plate according to one embodiment of the disclosure.

FIG. 10 is a schematic cross-sectional diagram of fabricating a HEMT according to one embodiment of the present disclosure, where includes a second interlayer dielectric layer covering a second field plate. After the process of FIG. 9 is completed, photolithography and etching processes may be performed to pattern the second metal layer 139 to form a first source layer 132 in the source contact hole 138, a second field plate 133 above the first field plate 150, and a first drain layer 142 in the drain contact hole 148. A suitable deposition process may be subsequently performed to form a conformal second interlayer dielectric layer 164 on the top surface of the second field plate 133, in the source contact hole 138, and in the drain contact hole 148.

Various suitable processes, such as photolithography, etching, deposition, planarization, and/or heat treatment, may be subsequently performed to form metal layers and/or insulating layers on the second interlayer dielectric layer 164 to obtain the structure similar to the embodiment of FIG. 1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a high electron mobility transistor, comprising:

providing a substrate having a semiconductor channel layer, a semiconductor barrier layer, and a passivation layer disposed thereon;

forming a gate field plate and at least one first field plate, wherein the gate field plate and the at least one first field plate are laterally spaced apart from each other, and the step of forming the gate field plate and the at least one first field plate comprises:

forming a conformal first metal layer on a surface of the passivation layer; and patterning the conformal first metal layer;

forming a first interlayer dielectric layer, conformally covering the gate field plate and the at least one first field plate, wherein the first interlayer dielectric layer comprises:

a recessed region disposed directly above a gap between the gate field plate and the at least one first field plate, and raised regions disposed directly above the gate field plate and the at least one first field plate; and forming a source electrode and a second field plate, wherein the second field plate conformally covers the first interlayer dielectric layer and extends over the gate field plate and the at least one first field plate, and a top surface of the second field plate comprises:

a first portion disposed directly above and conformal with one of the raised regions corresponding to the gate field plate, a second portion disposed directly above and conformal with another one of the raised regions corresponding to the at least one first field plate, and a third portion disposed directly above and conformal with the recessed region, wherein the first portion and the second portion are higher than the third portion.

2. The method of fabricating the high electron mobility transistor of claim 1, wherein the passivation layer comprises a gate contact hole, and a portion of the conformal first metal layer fills in the gate contact hole.

3. The method of fabricating the high electron mobility transistor of claim 1, wherein the step of forming the source electrode and the second field plate comprises:

forming a conformal second metal layer on a surface of the first interlayer dielectric layer; and patterning the conformal second metal layer.

4. The method of fabricating the high electron mobility transistor of claim 1, wherein the area of the second field plate is larger than a sum of an area of the gate field plate and an area of the at least one first field plate when perceived from a top-down perspective.

5. The method of fabricating the high electron mobility transistor of claim 1, wherein:

the at least one first field plate is electrically floating or electrically connected to the source electrode; and the second field plate is electrically connected to the source electrode.

* * * * *